(12) United States Patent
Miyano

(10) Patent No.: US 8,732,512 B2
(45) Date of Patent: May 20, 2014

(54) SEMICONDUCTOR DEVICE HAVING DLL CIRCUIT

(76) Inventor: Kazutaka Miyano, Tokyo (JP)

(*) Notice: Subject to any disclaimer, the term of this patent is extended or adjusted under 35 U.S.C. 154(b) by 228 days.

(21) Appl. No.: 13/291,733

(22) Filed: Nov. 8, 2011

(65) Prior Publication Data

US 2012/0124409 A1    May 17, 2012

(30) Foreign Application Priority Data

Nov. 11, 2010 (JP) ................................. 2010-252680

(51) Int. Cl.
*H03L 7/00* (2006.01)
(52) U.S. Cl.
USPC .......................................... 713/503; 327/156
(58) Field of Classification Search
USPC ......................................................... 713/503
See application file for complete search history.

(56) References Cited

U.S. PATENT DOCUMENTS

| | | | |
|---|---|---|---|
| 6,373,303 B2 | 4/2002 | Akita | |
| 6,437,619 B2* | 8/2002 | Okuda et al. | 327/158 |
| 6,677,791 B2* | 1/2004 | Okuda et al. | 327/158 |
| 6,703,879 B2* | 3/2004 | Okuda et al. | 327/158 |
| 6,717,887 B1* | 4/2004 | Kono et al. | 365/189.14 |
| 7,028,206 B2* | 4/2006 | Waller | 713/400 |
| 7,043,652 B2* | 5/2006 | Matsui | 713/400 |
| 7,137,022 B2* | 11/2006 | Ishikawa | 713/400 |
| 7,143,303 B2* | 11/2006 | Sohn et al. | 713/503 |
| 7,298,189 B2* | 11/2007 | Kang et al. | 327/158 |
| 7,449,927 B2* | 11/2008 | Kim | 327/156 |
| 7,839,191 B2* | 11/2010 | Takai | 327/158 |
| 7,840,831 B2* | 11/2010 | Jang | 713/500 |
| 8,111,092 B2* | 2/2012 | Rombach et al. | 327/156 |
| 8,164,372 B2* | 4/2012 | Mitsubori et al. | 327/158 |
| 8,436,657 B2* | 5/2013 | Kitagawa | 326/82 |
| 2001/0043097 A1 | 11/2001 | Akita | |
| 2002/0017939 A1* | 2/2002 | Okuda et al. | 327/296 |
| 2002/0047742 A1* | 4/2002 | Setogawa | 327/544 |
| 2002/0180500 A1* | 12/2002 | Okuda et al. | 327/158 |
| 2004/0212413 A1* | 10/2004 | Lee | 327/158 |
| 2004/0222828 A1* | 11/2004 | Ishikawa | 327/156 |
| 2004/0227550 A1* | 11/2004 | Byun | 327/158 |
| 2005/0242854 A1* | 11/2005 | Kang et al. | 327/158 |
| 2005/0242864 A1* | 11/2005 | Kawasaki et al. | 327/261 |
| 2007/0069779 A1* | 3/2007 | Kim | 327/158 |
| 2007/0132493 A1* | 6/2007 | Fujisawa et al. | 327/158 |
| 2008/0239845 A1* | 10/2008 | Na | 365/194 |
| 2008/0301485 A1* | 12/2008 | Rombach et al. | 713/600 |

(Continued)

FOREIGN PATENT DOCUMENTS

JP    2007-022511    1/1995
JP    2008-097715    4/1996

(Continued)

*Primary Examiner* — Ryan Stiglic

(57) ABSTRACT

A semiconductor device with a clock control circuit that outputs an internal clock signal configured by delaying external clock signals based on at least a feedback clock signal; a plurality of output buffers that output data in synchronization with the internal clock signal; an output replica that is a replica of the output buffers and that generates the feedback clock signal in synchronization with the internal clock signal and supplies the feedback clock signal to the clock control circuit; and a clock tree that receives the internal clock signal from the clock control circuit and transmits the internal clock signal to the plurality of output buffers and the output replica such that signal line are substantially equal to one another.

21 Claims, 6 Drawing Sheets

(56) References Cited

U.S. PATENT DOCUMENTS

| | | | |
|---|---|---|---|
| 2009/0045857 A1* | 2/2009 | Kim | 327/158 |
| 2009/0284290 A1* | 11/2009 | Kuroki et al. | 327/158 |
| 2009/0289676 A1* | 11/2009 | Takai | 327/158 |
| 2010/0097111 A1* | 4/2010 | Hyun et al. | 327/158 |
| 2010/0123494 A1* | 5/2010 | Heightley | 327/158 |
| 2010/0226188 A1* | 9/2010 | Kim et al. | 365/194 |
| 2011/0169527 A1* | 7/2011 | Kitagawa | 326/82 |
| 2013/0093492 A1* | 4/2013 | Riho | 327/333 |
| 2013/0094272 A1* | 4/2013 | Riho | 365/63 |
| 2013/0176061 A1* | 7/2013 | Haerle et al. | 327/142 |

FOREIGN PATENT DOCUMENTS

| | | |
|---|---|---|
| JP | 2009-231196 | 9/1997 |
| JP | 2011-316617 | 11/1999 |
| JP | 2000-003589 | 1/2000 |
| JP | 2000-163961 | 6/2000 |
| JP | 2001-332086 A | 11/2001 |
| JP | 2006-333073 | 12/2006 |
| JP | 2007-116574 | 5/2007 |
| JP | 2008-060883 | 3/2008 |
| JP | 2010-146725 | 7/2010 |
| JP | 2010-193267 | 9/2010 |

* cited by examiner

SEMICONDUCTOR DEVICE HAVING DLL CIRCUIT

BACKGROUND OF THE INVENTION

1. Field of the Invention

The present invention relates to a semiconductor device, and especially relates to a semiconductor device that generates an internal clock signal using a DLL (Delay-Locked Loop) circuit.

2. Description of Related Art

In the recent years, semiconductor devices that perform operations in synchronization with clocks are widely used. For example, a DDR (Double Data Rate) type synchronous memory used as a main memory in a personal computer, etc. In such a semiconductor device, since there is a need to synchronize an output timing of read data to an external clock signal, a DLL circuit generating an internal clock signal in synchronization with the external clock signal is used. Japanese Patent Application Laid-Open No. 2001-332086 discloses an example of such a DLL circuit.

The DLL circuit is configured by including a delay circuit to generate the internal clock signal by delaying the external clock signal. The internal clock signal is transmitted to an output buffer to output the read data via a clock transmission circuit. The output buffer outputs the read data at the timing in synchronization with the internal clock signal that has been supplied as aforementioned.

Here, the internal clock signal is delayed during the transmission from the DLL circuit to the output buffer, and is further delayed inside the output buffer. Thus, in order to accurately synchronize the output timing of the read data with the external clock signal, the DLL circuit needs to generate the internal clock signal taking these delays into account. In order to do so, in the DLL circuit, a replica circuit that assimilates to the transmission path from the DLL circuit to the output buffer and the output buffer is used.

The replica circuit gives the same delay amount as those in the actual circuits (the transmission path from the DLL circuit to the output buffer and the output buffer) to the internal clock signal, and outputs the same as a feedback clock signal. The DLL circuit adjusts the delay amount in the delay circuit such that a rising phase of the feedback clock signal coincides with a rising phase of the external clock signal, and a duty ratio of the feedback clock signal is at a predetermined value (normally 50%). Due to this, the synchronization of the output timing of the read data with the external clock signal is realized.

In the recent years, acceleration in operation speed of the semiconductor devices has further progressed, and a permissible amount of an offset of the output timing of the read data is becoming small. Especially in regards to the duty ratio, even a subtle offset of 10 psec to 20 psec can no longer be permitted.

However, there is a limit of accuracy of the DLL circuit, and it has become difficult to cope with such acceleration as the years go by. As one reason of the limit of accuracy of the DLL circuit, a limit of accuracy in the replica circuit can be mentioned. The replica circuit is a circuit that assimilates to the transmission path from the DLL circuit to the output buffer and the output buffer as aforementioned, however, it is no more than a replica and is not the same as the actual circuits, so a feedback clock signal that is completely in synchronization with the output timing of the read data cannot be generated. Conventionally, improvements has somehow been made to the accuracy of the replica circuit by fine adjustments of the replica circuit in a testing stage, however, the improvement in accuracy of the replica circuit by the fine adjustment is almost at its limit, and a drastic improvement is being required.

SUMMARY

In one embodiment, there is provided a semiconductor device that includes: a clock control circuit outputting an internal clock signal obtained by delaying an external clock signal based on at least a first feedback clock signal; a plurality of data input/output terminals; a plurality of output buffers outputting a plurality of data to the data input/output terminals, respectively in synchronization with the internal clock signal, and each of the output buffers defining a first delay time as a time period from an input of the internal clock signal thereto to an output of the data therefrom, the first delay times of the output buffers being substantially equal to each other; a first replica circuit generating the first feedback clock signal based on the internal clock signal, and defining a second delay time as a time period from an input of the internal clock signal thereto to an output of the first feedback clock signal therefrom, the second delay time being substantially equal to the first delay time of each of the output buffers; and a clock transmission circuit including a plurality of first transmission paths that transmit the internal clock signal from the clock control circuit to the output buffers, respectively, and a second transmission path that transmits the internal clock signal from the clock control circuit to the first replica circuit, wherein the clock transmission circuit is configured such that signal line loads on the first transmission paths and the second transmission path are substantially equal to one another.

In another embodiment, there is provided a semiconductor device that includes: a clock control circuit outputting an internal clock signal generated by delaying an external clock signal such that a duty ratio of a first feedback clock signal is brought to be at a predetermined value; a plurality of data input/output terminals; a plurality of output buffers outputting a plurality of data to the data input/output terminals, respectively in synchronization with the internal clock signal, and each of the output buffers defining a first delay time as a time period from an input of the internal clock signal thereto to an output of the data therefrom, the first delay times of the output buffers being substantially equal to each other; a first replica circuit generating the first feedback clock signal based on the internal clock signal, supplying the first feedback clock signal to the clock control circuit, and defining a second delay time as a time period from an input of the internal clock signal thereto to an output of the first feedback clock signal therefrom, the second delay time being substantially equal to the first delay time of each of the output buffers; and a clock transmission circuit that includes transmission paths diverging respectively to the output buffers and the replica circuit to transmit the internal clock signal supplied from the clock control circuit to the output buffers and the replica circuit.

DETAILED DESCRIPTION OF THE EMBODIMENTS

Preferred embodiments of the present invention will be explained below in detail with reference to the accompanying drawings.

Figure 1:
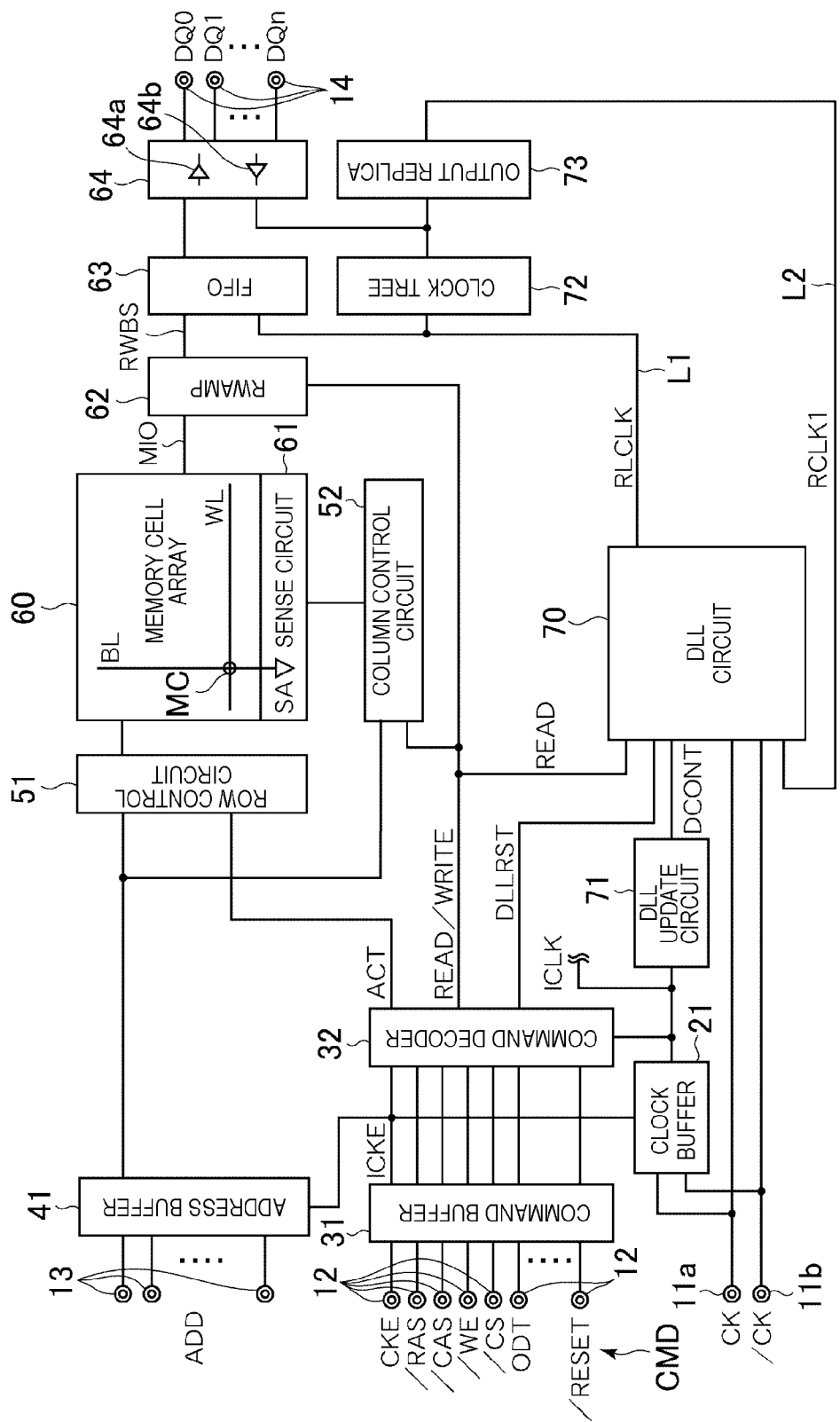
FIG. 1 is a block diagram showing an overall configuration of a semiconductor device according to a preferred first embodiment of the present invention.

Referring now to FIG. 1, the semiconductor device 10 according to the present embodiment is a DDR type SDRAM (Synchronous Dynamic Random Access Memory), and includes clock terminals 11a, 11b, command terminals 12, address terminals 13, and data input/output terminals 14. Further, although a power supply terminal, a data strobe terminal, etc. are also provided, indication of these is omitted in the drawings.

The clock terminals 11a and 11b are supplied with external clock signals CK and /CK, respectively. The external clock signals CK and /CK are supplied to a clock buffer 21 and a DLL circuit 70. In this specification, a signal with "/" appended to a first part of a signal name means that it is an inverted signal of a corresponding signal or a low active signal. Accordingly, the external clock signals CK, /CK are signals that complement one another. The clock buffer 21 generates a single-phase internal clock signal ICLK based on the external clock signals CK, /CK, and supplies the internal clock signal ICLK to a DLL update circuit 71 and other circuits that are not shown.

The DLL circuit 70 is a clock generating circuit that receives the external clock signals CK, /CK, and generates an internal clock signal RLCLK that is phase controlled relative to the external clock signals CK, /CK and duty controlled. The generated internal clock signal RLCLK is supplied to a FIFO circuit 63 and the clock tree 72 (clock transmission circuit) through a transmission path L1. Among these, the clock tree 72 is a circuit that distributes the supplied internal clock signal RLCLK to an input/output buffer 64 and an output replica 73. Details of the DLL circuit 70 and the clock tree 72 will be described later.

The DLL update circuit 71 generates a DLL update signal DCONT for every predetermined clock number of the internal clock signal ICLK, and supplies the DLL update signal DCONT to the DLL circuit 70. Accordingly, the DLL update signal DCONT is a periodic signal that is activated at a certain periodic cycle. Details of the DLL update signal DCONT will also be described later.

The command terminals 12 are supplied with various command signals CMD such as a clock enable signal CKE, a row address strobe signal/RAS, a column address strobe signal/CAS, a write enable signal/WE, a chip select signal/CS, an on-die termination signal ODT, a reset signal/RESET, etc. These command signals CMD are supplied to a command buffer 31. The command buffer 31 reshapes these command signals CMD and supplies them to a command decoder 32. As for the clock enable signal CKE, it is supplied to the clock buffer 21 and an address buffer 41 as an internal clock enable signal ICKE. The clock buffer 21 and the address buffer 41 operate only when the internal clock enable signal ICKE is activated.

The command decoder 32 generates various internal commands by retaining, decoding, counting the command signals CMD, etc. These internal commands include various commands related to reading/writing of memory cells such as an active command ACT, a read command READ, a write command WRITE, etc., and in addition to these, a DLL reset command DLLRST that is generated in response to the reset signal/RESET being inputted. Of the generated internal commands, the active command ACT is supplied to a row control circuit 51, the read command READ and the write command WRITE are supplied to a column control circuit 52 and a read/write amplifier (RWAMP) 62, and the DLL reset command DLLRST is supplied to the DLL circuit 70, respectively. The read command READ includes a one-shot type signal that is temporarily activated upon a start of a read operation, and a relatively long-lived signal that is activated continuously during the read operation; and the latter is supplied also to the DLL circuit 70.

The address terminals 13 are supplied with an address signal ADD. The address signal ADD supplied thereto is supplied to the address buffer 41. The address signal ADD supplied to the address buffer 41 is latched, and further, a row address thereof is supplied to the row control circuit 51, and a column address thereof is supplied to the column control circuit 52. Further, in a case where an entry is made in a mode register set, the address signal ADD is supplied to a mode register not shown, and thereby contents of the mode register is updated.

The row control circuit 51 selects one of word lines WL included in a memory array 60 based on the row address supplied from the address buffer 41. In the memory cell array 60, a plurality of word lines WL and a plurality of bit lines BL intersect one another, and memory cells MC are arranged at intersections thereof (in FIG. 1, only one word line WL, one bit line BL, and one memory cell MC are shown). The bit lines BL are connected to corresponding sense amplifiers SA in a sense circuit 61.

The column control circuit 52 selects one of the sense amplifiers SA included in the sense circuit 61. The sense amplifier SA selected by the column control circuit 52 is connected to a read/write amplifier 62 via a main I/O line MIO.

In the read operation, read data DQ amplified by the sense amplifiers SA is further amplified in the read/write amplifier 62, and is outputted outside from the data input/output terminals 14 via the FIFO 63 and the input/output buffer 64. On the other hand, in a write operation, write data DQ inputted from outside through the data input/output terminals 14 is inputted to the read/write amplifier 62 via the FIFO 63 and the input/output buffer 64, and is supplied to the sense amplifiers SA after being amplified.

The data input/output terminals 14 are terminals outputting the read data DQ and inputting the write data DQ. In the semiconductor device 10, n+1 pieces (n≥0) of the data input/output terminals 14 are provided, and n+1 bits of data can be input or output simultaneously. In many cases, n is 7 or 15, and in the present specification, the explanation will be continued under a premise that n=7.

The FIFO 63 is a first-in, first-out circuit that queues the read data DQ or the write data DQ, and is provided for each of the data input/output terminals 14. In explaining by focusing on the read operation, the read data outputted from the read/write amplifier 62 is distributed to each data input/output terminal 14 by a multiplexer not shown, and is queued to the corresponding FIFO 63. The FIFO 63 outputs the queued data to the input/output buffer 64 at the timing in synchronization with the internal clock RLCLK.

The input/output buffer 64 is configured by including output buffers 64a and input buffers 64b that are provided respectively for each data input/output terminal 14. Focusing on the read operation, it is explained that the output buffers 64a reshape the read data outputted from their corresponding FIFO 63, and output the data to outside from their corresponding data input/output terminals 14 at the timing in synchronization with the internal clock RLCLK.

In the semiconductor device 10, an output replica 73 (first replica circuit) that is a replica of the output buffers 64a is provided at a position adjacent to the input/output buffer 64. A replica refers to a circuit having a signal line load substantially equal to that of a target circuit. The signal line load is a load imposed on a signal passing through a signal line, and is determined by the number of buffers (transistors) to be provided in the signal line, profile of each transistor, a length and width of the signal line, etc. In a case where an identical clock signal is inputted to two circuits having substantially equal signal line loads, a difference in delay amounts of the clock signals outputted respectively becomes small enough to ignore from a viewpoint of a required accuracy of the DLL circuit 70. The output replica 73 generates a feedback clock signal RCLK1 (first feedback clock signal) in synchronization with the internal clock signal RLCLK supplied from the clock tree 72, and outputs the feedback clock signal RCLK1 to the DLL circuit 70 via a transmission path L2.

The foregoing is the overall configuration of the semiconductor device 10 of the present embodiment. Next, the DLL circuit 70 and other configurations relevant thereto will be explained in detail.

Figure 2:
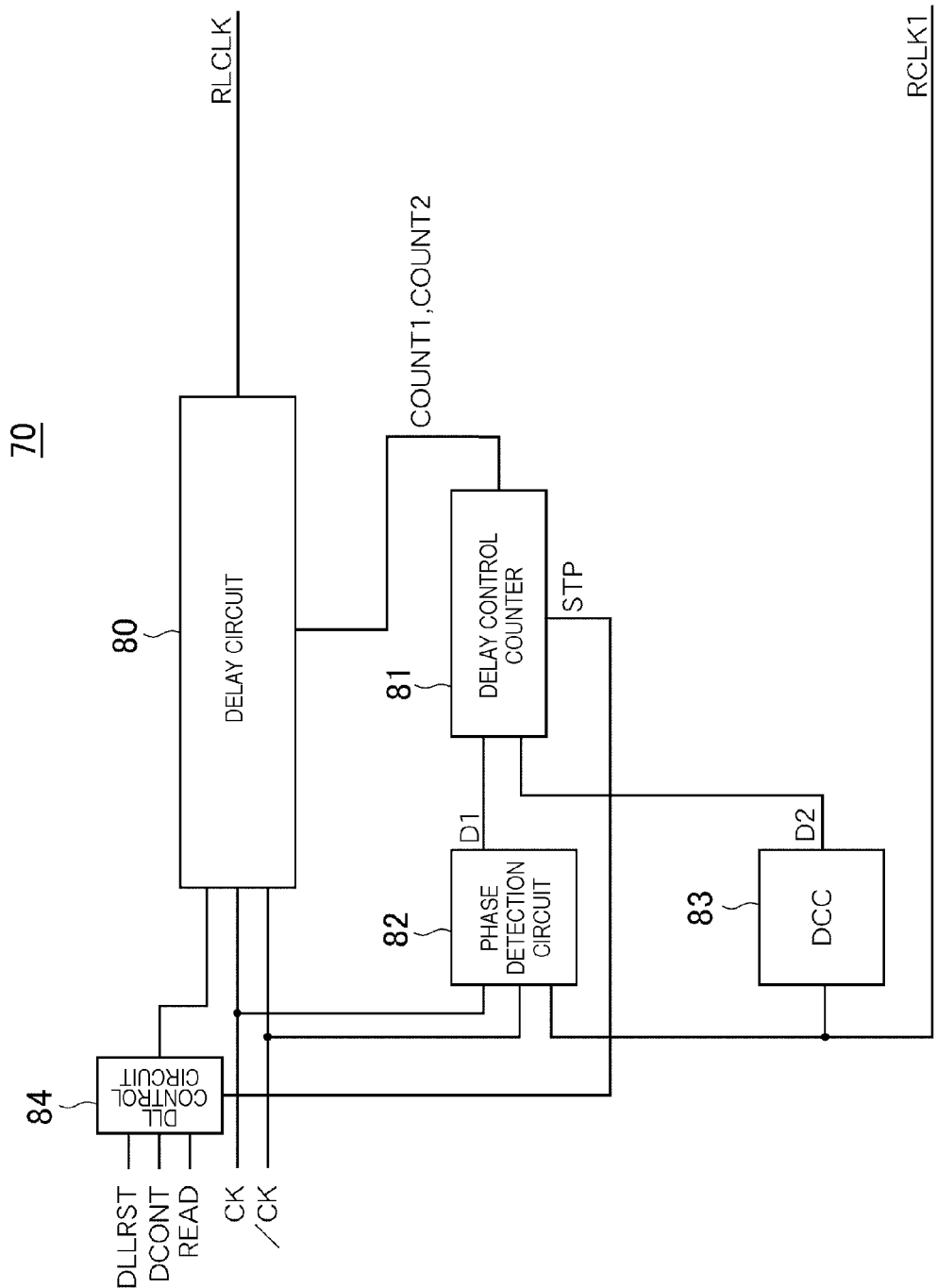
FIG. 2 is a diagram showing a circuit configuration of the DLL circuit shown in FIG. 1.

Turning to FIG. 2, the DLL circuit 70 according to the present embodiment is configured by including a delay circuit 80, a delay control counter 81 (delay control circuit), a phase detection circuit 82 (phase detection circuit), a DCC (Duty Correction Circuit) 83 (duty ratio detection circuit), and a DLL control circuit 84. Inside the DLL circuit 70, a replica circuit generating the feedback clock signal RCLK1 is not provided. Instead, as aforementioned, the feedback clock signal RCLK1 is generated by the output replica 73 as shown in FIG. 1. The DLL circuit 70 receives a supply of the feedback clock signal RCLK1 from the output replica 73, and generates the internal clock signal RLCLK by delaying the external clock signals CK, /CK based on the feedback clock signal RCLK1. Hereinafter, each circuit will be explained in detail.

The delay circuit 80 is configured of delay lines that generate the single phase internal clock signal RLCLK by delaying the external clock signals CK, /CK, and its delay amount is adjusted by the delay control counter 81. Although not specifically limited, the delay circuit 80 preferably includes coarse delay lines that delay the external clock signals CK, /CK at a relatively coarse adjustment pitch, and fine delay lines that delay the external clock signals CK, /CK at a relatively fine adjustment pitch.

The phase detection circuit 82 is a circuit that receives the external clock signals CK, /CK and the feedback clock signal RCLK1, detects phase differences thereof, and determines whether the phase of the feedback clock signal RCLK1 is ahead or behind relative to the external clock signals CK, /CK. A determination result is outputted to the delay control counter 81 as a determination result signal D1.

The DCC 83 is a circuit that receives the feedback clock signal RCLK1, detects a duty ratio thereof, and determines whether the detected duty ratio is larger or smaller than a predetermined value (e.g. 50%). A determination result is outputted to the delay control counter 81 as a determination result signal D2.

The delay control counter 81 is a circuit that controls the delay amount in the delay circuit 80 based on the determination result signals D1, D2. Specifically, the delay control counter 81 includes first and second counters (not shown), and performs countup and countdown by the first counter based on the determination result signal D1 as well as countup and countdown by the second counter based on the determination result signal D2. Notably, the countup and the countdown by the delay control counter 81 may be performed in synchronization with the external clock signals CK, /CK, or may be performed, by generating a divided clock of the external clock signals CK, /CK, in synchronization with the divided clock.

A count value COUNT1 of the first counter and a count value COUNT2 of the second counter are respectively supplied to the delay circuit 80. The delay circuit 80 delays the external clock signals CK, /CK by the delay amounts based on these count values COUNT1, COUNT2. Specifically, the delay circuit 80 selects a delay amount of a rising phase of the internal clock signal RLCLK based on the count value COUNT1, and selects a delay amount of a falling phase of the internal clock signal RLCLK based on the count value COUNT2. By the former, the rising phase of the read data synchronizes with the external clock signals CK, /CK, and by the latter, the duty ratio of the read data comes to be at the aforementioned predetermined value.

The delay control counter 81 also has a function of determining whether the DLL circuit 70 has been locked based on the count values COUNT1, COUNT2. In a case where it is determined that the DLL circuit 70 has been locked, the delay control counter 81 activates a stop instructing signal STP for a certain period of time.

A detailed explanation will be given in regards to the determination operation of being locked or not. When the DLL circuit 70 comes to be in a locked state, a rising phase of the feedback clock signal RCLK1 and rising phases of the external clock signals CK, /CK substantially match each other, and the duty ratio of the feedback clock signal RCLK1 comes to substantially match the predetermined target value. "Substantially match" herein means that it includes cases in which a variation exists around the completely matched value. In such cases, the count values COUNT1, COUNT2 respectively waver between two adjacent values. The delay control counter 81 is configured to be capable of detecting wavering patterns of the count values COUNT1, COUNT2, and after the counting operation has been started, in a case where the count values COUNT1, COUNT2 both exhibit the wavering patterns of wavering between two values as aforementioned, it is determined that the DLL circuit 70 has been locked.

The DLL control circuit 84 receives the aforementioned DLL reset command DLLRST, the DLL update signal DCONT, the read command READ, and the stop instructing signal STP, and operates the delay circuit 80 based thereon.

Figure 3:
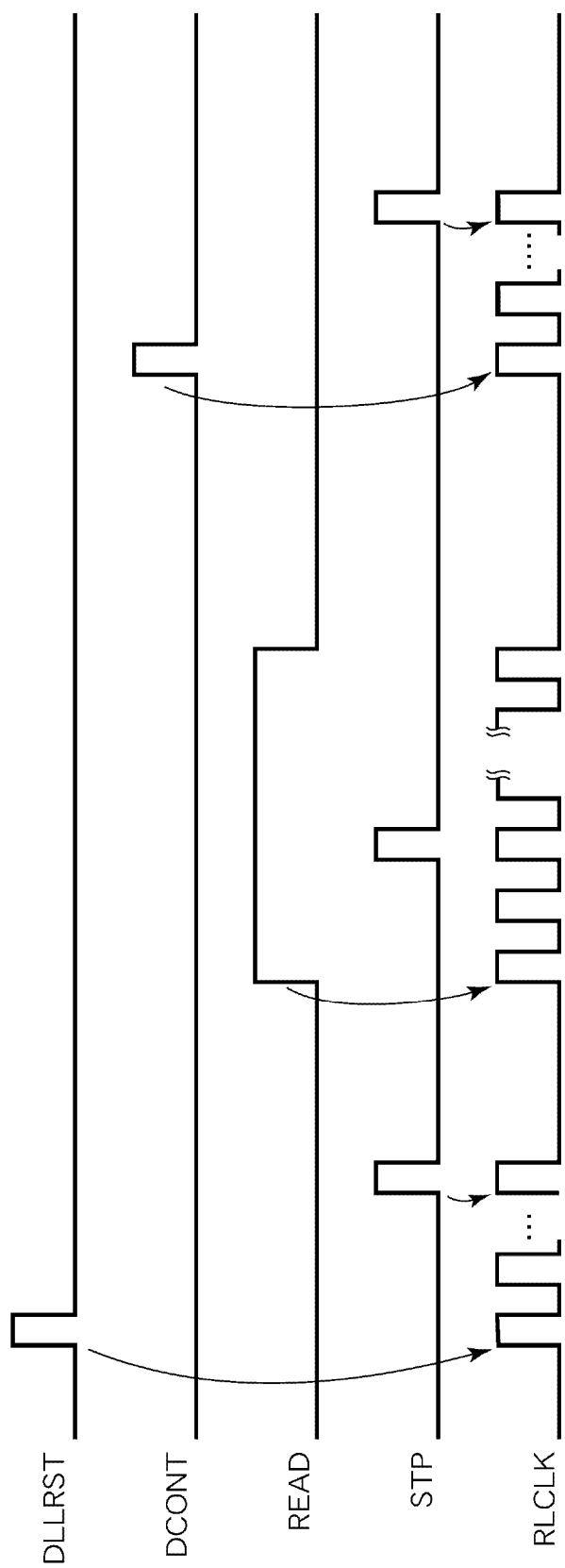
FIG. 3 is a timing chart showing an operation of a semiconductor device shown in FIG. 1.

FIG. 3 is a timing chart of the DLL reset command DLLRST, the DLL update signal DCONT, the read command READ, the stop instructing signal STP, and the internal clock signal RLCLK. As shown in the drawing, the DLL reset command DLLRST, the DLL update signal DCONT, and the stop instructing signal STP are one-shot signals that are activated temporarily for a certain period of time. When the DLL reset command DLLRST and the DLL update signal DCONT are activated, the DLL control circuit 84 keeps the delay circuit 80 operated during a period until the stop instructing signal STP is activated, i.e., until the DLL circuit 70 is locked. The operation of the DLL circuit 70 based on the DLL reset command DLLRST and the DLL update signal DCONT as such is performed so that the phase and the duty ratio of the internal clock signal RLCLK do not deviate significantly from their preferred values.

On the other hand, the read command READ is a signal that is continuously activated during the read operation as aforementioned. The DLL control circuit 84 operates the delay circuit 80 during when the read command READ is being activated. Due to this, the DLL circuit 70 is maintained in the locked state all through the read operation.

Next, a detailed explanation will be given on the configuration to drastically improve the accuracy of the replica circuit, which is the feature of the present invention.

As shown in FIG. 1, the circuit generating the feedback clock signal RCLK1 in the semiconductor device 10 is configured by the transmission path L1 from the DLL circuit 70 to the clock tree 72, the clock tree 72, the output replica 73, and the transmission path L2 from the output replica 73 to the DLL circuit 70.

Among these, the transmission path L1 is in common between the replica circuit and the actual circuits. Accordingly, the transmission path L1 does not generate any difference in the delay amount between the feedback clock signal RCLK1 and the internal clock signal RLCLK.

As for the delay inside the clock tree 72, the difference in the delay amount is prevented from being generated by devising the circuit configuration of the clock tree 72. This will be explained later in detail.

As for the delay in the output replica 73, since the output replica 73 is configured to have substantially the same signal line load as the output buffers 64a as aforementioned, the difference in the delay amount is at a level that does not cause any problem. Specifically, when each of the output buffers 64a defines a first delay time as a time period from an input of the internal clock signal RLCLK thereto to an output of the read data DQ0 to DQ7 therefrom, the output replica 73 defines a second delay time as a time period from an input of the internal clock signal RLCLK thereto to an output of the feedback clock signal RCLK1 therefrom. In this case, the first delay times of the output buffers 64a are substantially equal to each other; and the second delay time is substantially equal to the first delay time of each of the output buffers 64a. Notably, since the output replica 73 is a replica of only the output buffers 64a, it is easy to reduce the difference in the delay amount compared to the replica circuit as in the background art including the transmission path. Further, as will be described later, the output replica 73 is arranged adjacent to the output buffers 64a, and due to this also, the difference between the output replica 73 and the output buffers 64a is minimized.

As for the delay in the transmission path L2, the delay amount is reduced to a level that does not cause any problem by devising the arrangement of the respective circuits such that the transmission path L2 is as shortened as possible. This will also be explained later in detail.

Figure 4:
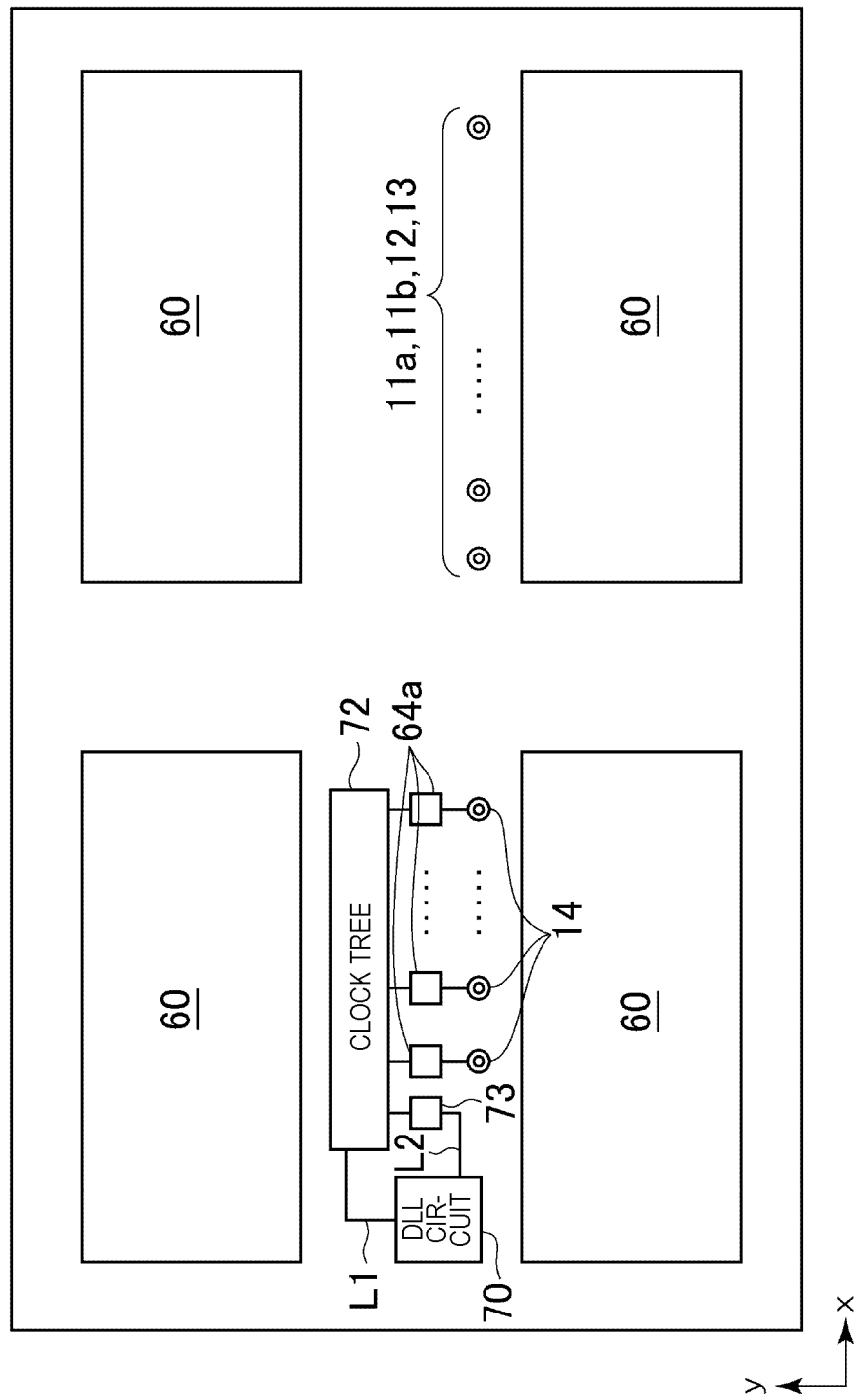
FIG. 4 is a plan view of the semiconductor device according to the preferred first embodiment of the present invention.

Firstly, the transmission path L2 will be explained. As shown in FIG. 4, in the semiconductor device 10, four memory cell arrays 60 are arranged in a matrix, and the clock terminals 11a, 11b, the command terminal 12, the address terminal 13, and the data input/output terminal 14 are arranged in a line in a region between the two memory cell arrays 60 aligning in a y-direction shown in the drawing.

The output buffers 64a and the output replica 73 are, as shown in FIG. 2, arranged aligning in an x-direction with the output replica 73 at the end. By employing such an arrangement, it becomes possible to simultaneously form the output buffers 64a and the output replica 73 in a narrow region on a surface of the same substrate. Consequently, since the output buffers 64a and the output replica 73 can be formed at almost the same condition, it becomes possible to match the signal line loads thereon at a high accuracy.

Of the both ends of the output replica 73 in the x-direction, the DLL circuit 70 is arranged on an opposite side from the output buffers 64a. Further, the DLL circuit 70 is arranged as close as possible to the output replica 73, in other words, adjacent to the output replica 73. By employing such an arrangement, in the semiconductor device 10, the transmission path L2 as shown in FIG. 4 is made significantly short. Consequently, the delay in the transmission path L2 is realized to be reduced to a level that can be ignored from the viewpoint of accuracy of the DLL circuit 70.

Figure 5:
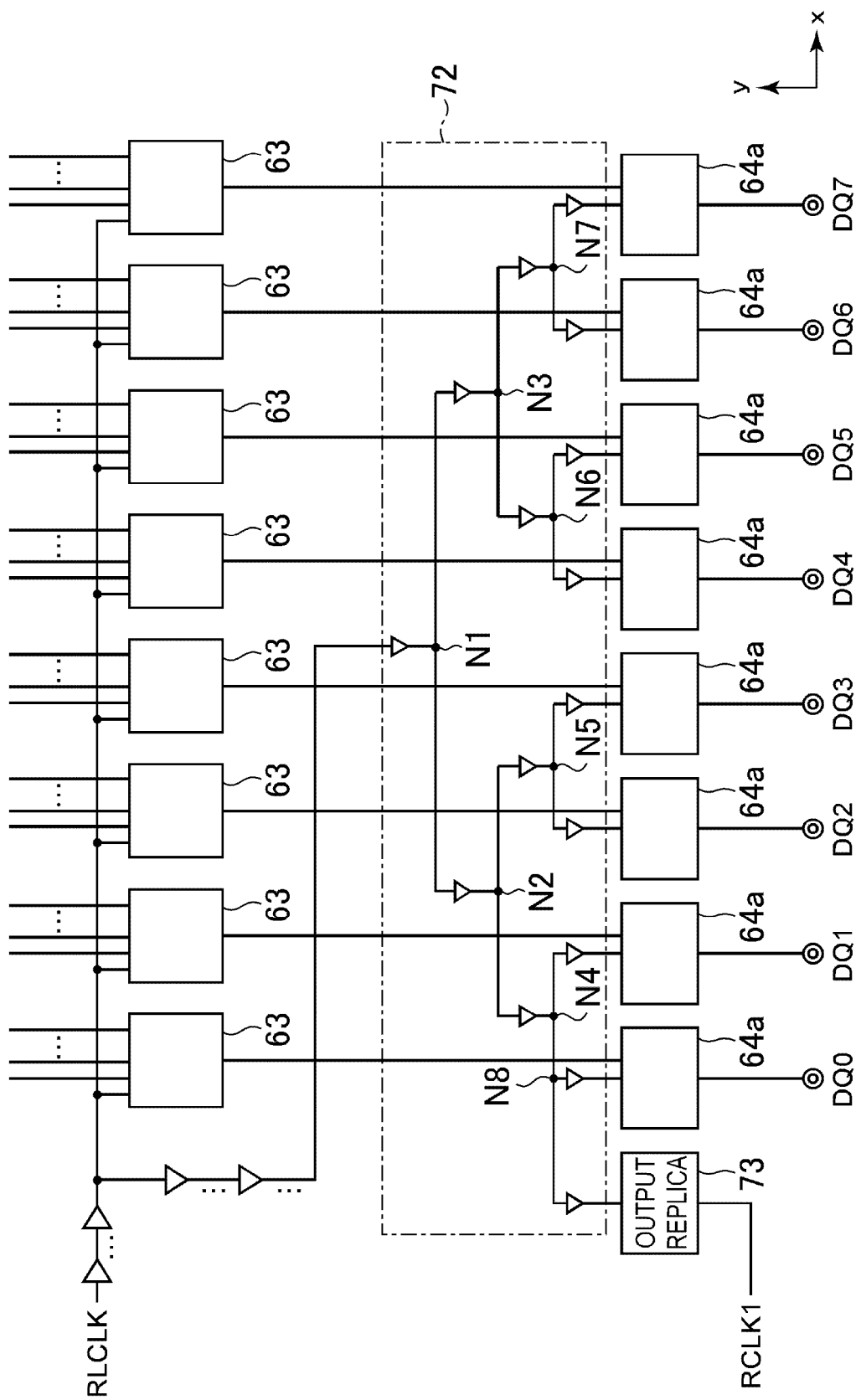
FIG. 5 is a circuit diagram showing a circuitry configuration of the clock tree 72 shown in FIG. 4.

Next, the clock tree 72 will be explained. FIG. 5 is a circuit diagram showing a circuitry configuration of the clock tree 72. As shown in the drawing, the clock tree 72 has a node N1 as a connecting point with the DLL circuit 70, and has transmission paths extended by diverging into two paths with mutually equaling distances at each node from nodes N2, N3 at the second level to the respective output buffers 64a via nodes N4 to N7 in the third level. Due to this, for each of the eight output buffers 64a arranged in a line, the transmission of the internal clock signal RLCLK with mutually equaling path lengths is realized. In between the nodes, a buffer for reshaping the signal waveform is provided.

The transmission path to the output replica 73 is secured by diverging the transmission path to the output buffer 64a adjacent to the output replica 73 at the node N8 as shown in the drawing. The node N8 is provided between the node N4 and the buffer provided between the node N4 and the output buffer 64a, and a buffer for reshaping the signal waveform is also provided between the node N8 and the output replica 73.

By configuring the clock tree 72 as aforementioned, signal line loads on a plurality of transmission paths for the internal clock signal RLCLK respectively from the DLL circuit 70 to the respective output buffers 64a and the output replica 73 are made substantially equal to one another. That is, although the line lengths may be somewhat different, since the number of the buffers that impose great influence on the signal line loads is made equal among the respective output buffers 64a and the output replica 73, it can be said that the signal line loads on the transmission paths are substantially equal.

Note that, it goes without saying that the path lengths of the transmission paths may be equal to one another among the plurality of output buffers 64a and the output replica 73. For example, this may be realized by providing a bypass section for adjusting the path lengths to the respective transmission paths.

As explained above, according to the semiconductor device 10 according to the present embodiment, among the transmission paths of the internal clock signal RLCLK, the transmission path L1 from the DLL circuit 70 to the clock tree 72 generates the feedback clock signal RCLK1 using the actual circuits. Accordingly, compared to the background art, accuracy of the replica circuit can be improved drastically.

Further, in the clock tree 72, the signal line loads on the transmission paths of the internal clock signal RLCLK is made substantially equal to one another between the output buffers 64a and the output replica 73. Due to this, accuracy of the replica circuit can further be improved.

Further, by arranging the output buffers 64a, the output replica 73 and the DLL circuit 70 in this order in a line, the signal line load on the output replica 73 and the signal line loads on the output buffers 64a can be made to match one another at a high accuracy, and the delay in the transmission path L2 can be suppressed to the level that can be ignored from the viewpoint of accuracy of the DLL circuit 70.

Figure 6:
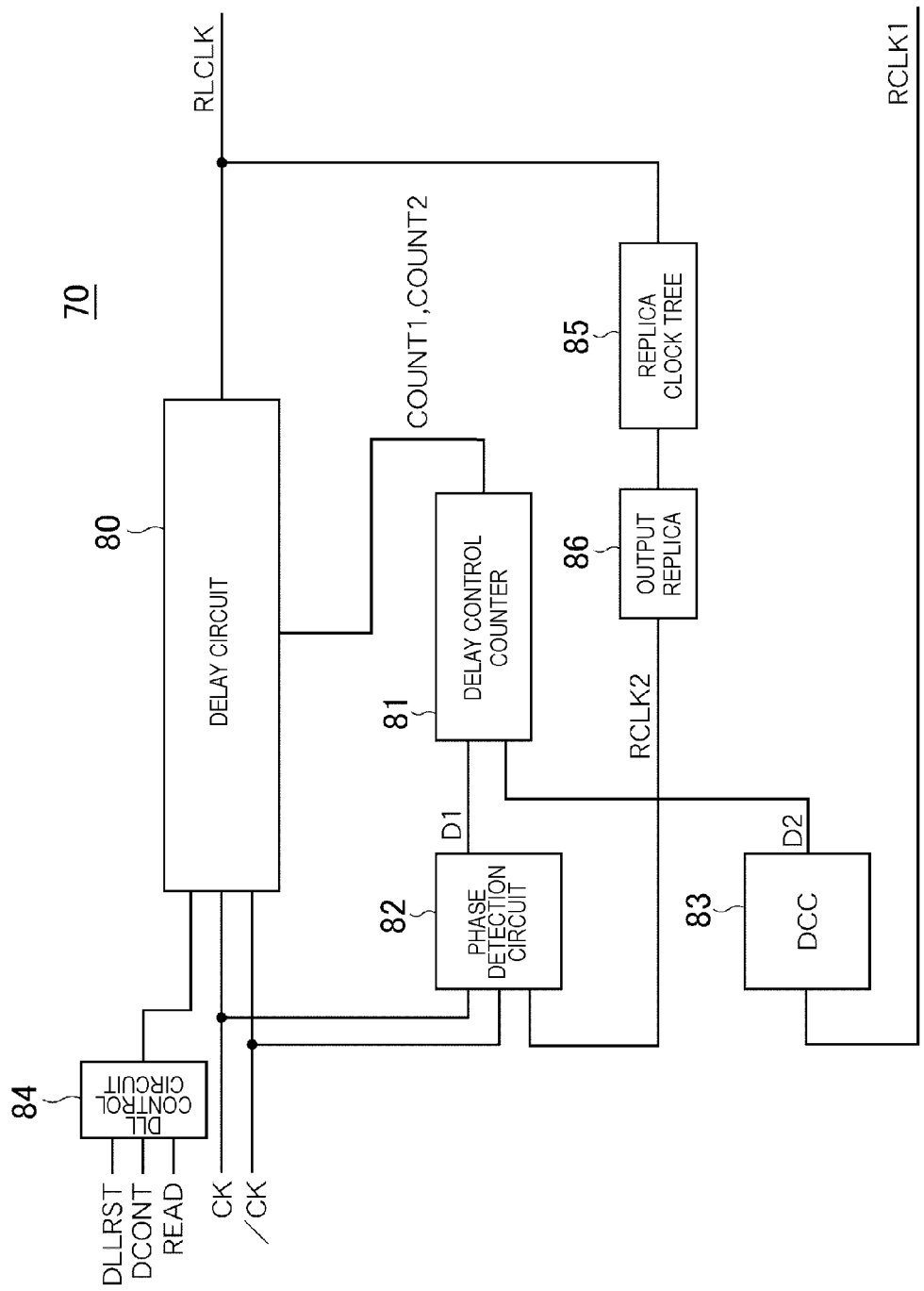
FIG. 6 is a block diagram showing a circuit configuration of the DLL circuit shown in FIG. 1.

FIG. 6 is a block diagram showing a circuit configuration of the DLL circuit 70 included in the semiconductor device 10 according to a preferred second embodiment of the present invention. As shown in the drawing, the semiconductor device 10 according to the present embodiment differs from the semiconductor device 10 of the first embodiment in regards to the internal configuration of the DLL circuit 70.

Specifically, the feedback clock signal RCLK1 (first feedback clock signal) explained in the first embodiment is used only for the detection of the duty ratio, and the replica circuit similar to that of the background art (the replica circuit installed inside the DLL circuit 70) is used for the detection of the phase difference. Other features are as explained in the first embodiment, thus, same reference signs are given to configurations identical to those of the first embodiment, and the differences will mainly be explained in detail hereinbelow.

As shown in FIG. 6, the DLL circuit 70 according to the present embodiment further includes a replica clock tree 85 and an output replica 86 in addition to the respective circuits explained in the first embodiment. The replica clock tree 85 is a replica of the transmission path L1 and the clock tree 72 shown in FIG. 1, and the output replica 86 is a replica of the output buffers 64*a* similar to the output replica 73 shown in FIG. 1. By the replica clock tree 85 and the output replica 86, a replica circuit (second replica circuit) of the transmission path of the internal clock signal RLCLK that leads to one of the plurality of data input/output terminals 14 from the DLL circuit 70 is configured. The replica clock tree 85 and the output replica 86 extract the internal clock signal RLCLK from a vicinity of the output terminal of the delay circuit 80, and generate a feedback clock signal RCLK2 (second feedback clock signal) in synchronization with this internal clock signal RLCLK.

The feedback clock signal RCLK2 is inputted to the phase detecting circuit 82 instead of the feedback clock signal RCLK1. Consequently, the phase detecting circuit 82 detects the phase differences between the external clock signals CK, /CK and the feedback clock signal RCLK2, and determines whether the phase of the feedback clock signal RCLK2 is ahead or behind relative to the external clock signals CK, /CK. A determination result signal D1 is a signal indicating the result of this determination.

As explained above, in the present embodiment, the feedback clock signal RCLK2 is used for the detection of the phase difference. Due to this, the detection accuracy of the phase difference is prevented from being influenced by the delay in the transmission path L2. A reduction is obtained. Hereinbelow, a detailed explanation will be given.

The duty ratio is determined by the time difference between the rising phase and the falling phase, so the duty ratio normally does not change during the transmission through the transmission path L2. Consequently, just because the feedback clock signal RCLK1 has passed through the transmission path L2, the detection result of the duty ratio by the DCC 83 is not influenced thereby.

On the other hand, since the phase difference is determined by an absolute time of the rising phase of the feedback clock signal RCLK1, it experiences some change during the transmission through the transmission path L2. Consequently, in the first embodiment, the feedback clock signal RCLK1 passing through the transmission path L2 imposes influence on detection accuracy of the phase difference by the phase detection circuit 82.

Contrary to this, in the present embodiment, the feedback clock signal RCLK1 is used only for the detection of the duty ratio by the DCC 83, and the feedback clock signal RCLK2 generated inside the DLL circuit 70 is used for the detection of the phase differences by the phase detection circuit 82. Consequently, the detection accuracy of the phase difference is prevented from being influenced by the delay in the transmission path L2.

In the present embodiment, since the replica circuit similar to that of the background art is used for detection of phase differences, the drastic improvement in accuracy of the replica circuit as explained in the first embodiment is applied only for duty ratios, and such is not applied to phase differences. However, as aforementioned, at least at this point, it is a duty ratio whose required accuracy is becoming severe due to influences of acceleration of semiconductor devices. Accordingly, if drastic improvement can be achieved in accuracy of the replica circuit in regards to duty ratio, it can be said that the effect of the invention is sufficiently achieved.

As for selecting which of the first embodiment and the second embodiment in regards to the phase difference, one with better accuracy in a phase difference detection may be selected by comparatively weighing a degree of deterioration in the accuracy by the delay in the transmission path L2 and a degree of deterioration in the accuracy by differences in the delay amount between the replica circuit installed inside the DLL circuit 70 and the actual circuits based on actual measurement results, etc.

It is apparent that the present invention is not limited to the above embodiments, but may be modified and changed without departing from the scope and spirit of the invention.

For example, in the above embodiments, examples in which the present invention has been applied to the DLL circuit that controls both a phase and a duty ratio, however, the present invention can be applied to a DLL circuit that controls only one of them. Notably, the present invention is especially preferable for the DLL circuit that controls a duty ratio.

Further, in the above embodiments, although examples in which the present invention has been applied to the SDRAM are given, the present invention may widely be applied to any semiconductor devices including one for the logic use and one for the memory use, as long as the semiconductor device performs read data outputs in synchronization with external clock signals.

What is claimed is:

1. A semiconductor device comprising:
   a clock control circuit outputting an internal clock signal obtained by delaying an external clock signal based on at least a first feedback clock signal;
   a plurality of data input/output terminals;
   a plurality of output buffers outputting a plurality of data to the data input/output terminals, respectively in synchronization with the internal clock signal, and each of the output buffers defining a first delay time as a time period from an input of the internal clock signal thereto to an output of the data therefrom, the first delay times of the output buffers being substantially equal to each other;
   a first replica circuit generating the first feedback clock signal based on the internal clock signal, and defining a second delay time as a time period from an input of the internal clock signal thereto to an output of the first feedback clock signal therefrom, the second delay time being substantially equal to the first delay time of each of the output buffers; and
   a clock tree circuit including a plurality of first multi-buffer transmission paths that transmit the internal clock signal from the clock control circuit to the output buffers, respectively, and a second multi-buffer transmission path that transmits the internal clock signal from the clock control circuit to the first replica circuit, wherein the clock tree circuit is configured such that signal line loads on the first multi-buffer transmission paths and the second multi-buffer transmission path are substantially equal to one another.

2. The semiconductor device as claimed in claim 1, wherein the output buffers and the first replica circuit are arranged in a line along a first direction such that the first replica circuit is located at an end of the line, and the clock control circuit is arranged such that the first replica circuit is located between the clock control circuit and the output buffers.

3. The semiconductor device as claimed in claim 1, wherein the clock tree circuit is configured such that a number of buffers included in each of the first and second multi-buffer transmission paths is equal to one another.

4. The semiconductor device as claimed in claim 1, wherein the clock tree circuit is configured such that the length of each of the first and second multi-buffer transmission paths is equal to one another.

5. The semiconductor device as claimed in claim 1, wherein the clock control circuit includes:
   a delay circuit that generates the internal clock signal by delaying the external clock signal; a duty ratio detection circuit that detects a duty ratio of the first feedback clock signal;
   a phase detection circuit that detects a phase difference between the external clock signal and the first feedback clock signal; and
   a delay control circuit that controls a delay amount in the delay circuit based on the duty ratio detected by the duty ratio detection circuit and the phase difference detected by the phase detection circuit.

6. The semiconductor device as claimed in claim 1, wherein the clock control circuit includes:
   a second replica circuit that generates a second feedback clock signal based on the internal clock signal, the second replica circuit having substantially the same delay amount of one of the first multi-buffer transmission paths;
   a delay circuit that generates the internal clock signal by delaying the external clock signal;
   a duty ratio detection circuit that detects a duty ratio of the first feedback clock signal;
   a phase detection circuit that detects a phase difference between the external clock signal and the second feedback clock signal; and
   a delay control circuit that controls a delay amount in the delay circuit based on the duty ratio detected by the duty ratio detection circuit and the phase difference detected by the phase detection circuit.

7. The semiconductor device of claim 1, wherein each of the plurality of first multi-buffer transmission paths transmit the internal clock signal to a respective single one of the plurality of output buffers.

8. A semiconductor device comprising:
   a clock control circuit outputting an internal clock signal generated by delaying an external clock signal such that a duty ratio of a first feedback clock signal is brought to be at a predetermined value;
   a plurality of data input/output terminals;
   a plurality of output buffers outputting a plurality of data to the data input/output terminals, respectively in synchronization with the internal clock signal, and each of the output buffers defining a first delay time as a time period from an input of the internal clock signal thereto to an output of the data therefrom, the first delay times of the output buffers being substantially equal to each other;
   a first replica circuit that is a replica of each output buffer for generating the first feedback clock signal based on the internal clock signal, supplying the first feedback clock signal to the clock control circuit, and defining a second delay time as a time period from an input of the internal clock signal thereto to an output of the first feedback clock signal therefrom, the second delay time being substantially equal to the first delay time of each of the output buffers; and
   a clock tree circuit that includes multi-buffer transmission paths diverging respectively to the output buffers and the replica circuit to transmit the internal clock signal supplied from the clock control circuit to the output buffers and the replica circuit.

9. The semiconductor device as claimed in claim 8, wherein the clock control circuit generates the internal clock signal by delaying the external clock signal such that phases of the external clock signal and the first feedback clock signal match each other and the duty ratio of the first feedback clock signal is brought to be at the predetermined value.

10. The semiconductor device as claimed in claim 8, wherein the clock control circuit includes a second replica circuit that generates a second feedback clock signal based on the internal clock signal, the second replica circuit having substantially the same characteristics of one of the multi-buffer transmission paths, and the clock control circuit generates the internal clock signal by delaying the external clock signal such that phases of the external clock signal and the second feedback clock signal match each other and the duty ratio of the first feedback clock signal is brought to be at the predetermined value.

11. The semiconductor device as claimed in claim 8, wherein the clock tree circuit is configured such that a number of buffers included in each of the multi-buffer transmission paths is equal to one another.

12. The semiconductor device as claimed in claim 8, wherein a number of buffers included in each of the first replica circuit and each output buffer is equal to one another so that the first replica circuit has a signal line load substantially equal to a signal line load for each output buffer.

13. The semiconductor device as claimed in claim 8, wherein the clock tree circuit is configured such that signal line loads on the multi-buffer transmission paths of the internal clock signal from the clock control circuit to the output buffers and the first replica circuit are substantially equal to one another.

14. The semiconductor device as claimed in claim 8, wherein the output buffers and the first replica circuit are arranged in a line along a first direction such that the first replica circuit is located at an end of the line, and the clock control circuit is arranged such that the first replica circuit is located between the clock control circuit and the output buffers.

15. A semiconductor device comprising:
   a set of output buffers arranged adjacently to each other, each of the output buffers operating in synchronism with a first clock signal and having a first signal line load;
   a clock control circuit responding to second and third clock signals to control a phase of the first clock signal; and
   a replica buffer having a second signal line load that is substantially equal to the first signal line load, where the replica buffer is arranged between the clock control circuit and the set of the output buffers to produce the second clock signal in response to the first clock signal.

16. The device as claimed in claim 15, wherein the replica buffer and the output buffers are arranged in line.

17. The device as claimed in claim 15, wherein the third clock signal is supplied from an outside of the device and the clock control circuit comprises DLL circuit.

18. The device as claimed in claim 15, wherein the clock control circuit outputs a fourth clock signal in response to the second and third clock signals, the device further comprising a clock tree circuit receiving the fourth clock signal, the clock tree circuit distributing the fourth clock signal to the output buffers and the replica buffer as the first clock signals, respectively, such that the first clock signals are substantially coincident in phase with one another.

19. The device as claimed in claim 15, further comprising a set of input/output terminals, each of the output buffers being coupled to a corresponding one of the input/output terminals to communicate with an outside of the device, the replica buffer being electrically independent of any of the input/output terminals to be electrically disconnected from the outside of the device.

20. The device as claimed in claim 15, wherein the clock control circuit adjusts the phase of the first clock signal to match a phase of the second clock signal and a phase of the third clock signal.

21. The device as claimed in claim 20, wherein the clock control circuit further adjusts a duty ratio of the first clock signal such that a first time period between a rising edge and a trailing edge of the first clock signal becomes equal to a second time period between the trailing edge and a following rising edge.

* * * * *